US010630150B2

(12) United States Patent
Tsuboi et al.

(10) Patent No.: US 10,630,150 B2
(45) Date of Patent: Apr. 21, 2020

(54) HOUSING MEMBER AND DRIVE DEVICE HAVING THE SAME

(71) Applicant: DENSO CORPORATION, Kariya, Aichi-pref. (JP)

(72) Inventors: Takashi Tsuboi, Kariya (JP); Koji Matsuo, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 16/393,099

(22) Filed: Apr. 24, 2019

(65) Prior Publication Data

US 2019/0252953 A1   Aug. 15, 2019

Related U.S. Application Data

(63) Continuation of application No. PCT/JP2017/037915, filed on Oct. 20, 2017.

(30) Foreign Application Priority Data

Oct. 26, 2016  (JP) .................................. 2016-209579

(51) Int. Cl.
*H05K 5/00* (2006.01)
*H05K 5/06* (2006.01)
(Continued)

(52) U.S. Cl.
CPC .............. *H02K 11/33* (2016.01); *B25J 9/126* (2013.01); *F16J 15/14* (2013.01); *H02K 5/10* (2013.01);
(Continued)

(58) Field of Classification Search
CPC ...... H05K 5/0052; H05K 5/06; H05K 5/0013; H05K 5/0069; H05K 5/10; H05K 5/13;
(Continued)

(56) References Cited

U.S. PATENT DOCUMENTS 4,409,641 A * 10/1983 Jakob ................. H05K 7/20854
361/720
5,515,240 A * 5/1996 Rodeffer .............. H05K 5/0013
206/449
(Continued)

FOREIGN PATENT DOCUMENTS

JP  2013-105766 A   5/2013
JP  2013-222783 A   10/2013
(Continued)

*Primary Examiner* — Kimberley S Wright
(74) *Attorney, Agent, or Firm* — Knobbe, Martens, Olson & Bear, LLP (57) ABSTRACT

A housing member includes a case member and a cover member having an insertion portion inserted into a seal groove. The case member and the cover member assembled together provide a housing space for housing a protective component inside. A housing space side inner groove surface of a peripheral wall portion and an external space side inner groove surface of the peripheral wall portion extend along an insertion direction of the insertion portion into the seal groove. A first distance between the external space side peripheral surface and the external space side inner groove surface opposite to the external space side peripheral surface is larger than a second distance between a housing space side peripheral surface extending along the insertion direction on the housing space side of the insertion portion and the housing space side inner groove surface opposite to the housing space side peripheral surface.

9 Claims, 11 Drawing Sheets

(51) Int. Cl.
*H05K 7/14* (2006.01)
*H02K 11/33* (2016.01)
*B25J 9/12* (2006.01)
*H02K 5/10* (2006.01)
*H02K 5/22* (2006.01)
*F16J 15/14* (2006.01)
*H02K 11/30* (2016.01)

(52) U.S. Cl.
CPC ............... *H02K 5/22* (2013.01); *H02K 5/225* (2013.01); *H02K 11/30* (2016.01); *H05K 5/06* (2013.01); *H02K 2211/03* (2013.01)

(58) Field of Classification Search
CPC .......... H05K 5/062; H05K 5/22; H05K 5/225; H02K 11/33; H02K 11/30
See application file for complete search history.

(56) References Cited

U.S. PATENT DOCUMENTS

| | | | |
|---|---|---|---|
| 7,667,973 B2* | 2/2010 | Shinoda | H05K 5/0047 174/50 |
| 8,665,603 B2* | 3/2014 | Brieda | H05K 7/1417 361/752 |
| 9,949,394 B2* | 4/2018 | Kamoshida | H05K 5/0056 |
| 9,997,980 B2* | 6/2018 | Tsuboi | H05K 7/20854 |
| 10,064,297 B2* | 8/2018 | Hanada | H05K 5/0052 |
| 2006/0089034 A1* | 4/2006 | Chen | H05K 5/0013 439/164 |
| 2008/0081679 A1* | 4/2008 | Kawasaki | H04B 1/3888 455/575.8 |
| 2009/0068862 A1* | 3/2009 | Honda | H05K 5/0052 439/78 |
| 2012/0069532 A1* | 3/2012 | Azumi | H05K 5/0052 361/752 |
| 2012/0320544 A1* | 12/2012 | Ohhashi | H05K 5/0052 361/752 |
| 2013/0120943 A1* | 5/2013 | Tamura | H05K 5/0052 361/752 |
| 2013/0242484 A1* | 9/2013 | Schweichart | H05K 5/03 361/679.01 |
| 2013/0271933 A1 | 10/2013 | Tanaka et al. | |
| 2014/0307399 A1 | 10/2014 | Tamura et al. | |
| 2015/0156927 A1* | 6/2015 | Tsuboi | H05K 7/20854 361/704 |
| 2015/0250072 A1 | 9/2015 | Ichikawa | |
| 2016/0094104 A1 | 3/2016 | Yamasaki | |
| 2016/0165736 A1* | 6/2016 | Tsuboi | H05K 7/20854 310/71 |
| 2016/0361676 A1* | 12/2016 | Zaiki | H05K 5/0239 |

FOREIGN PATENT DOCUMENTS

| | | | |
|---|---|---|---|
| JP | 2013-222786 A | 10/2013 | |
| JP | 2014-170669 A | 9/2014 | |
| JP | 2015-160552 A | 9/2015 | |
| JP | WO 2015146366 | * 10/2015 | ........... H05K 5/0056 |
| JP | 2016072996 A | 5/2016 | |
| JP | 2016109172 A | 6/2016 | |

* cited by examiner

HOUSING MEMBER AND DRIVE DEVICE HAVING THE SAME

CROSS REFERENCE TO RELATED APPLICATIONS

The present application is a continuation application of International Patent Application No. PCT/JP2017/037915 filed on Oct. 20, 2017, which designated the U.S. and claims the benefit of priority from Japanese Patent Application No. 2016-209579 filed on Oct. 26, 2016. The entire disclosures of all of the above applications are incorporated herein by reference.

TECHNICAL FIELD

The present disclosure relates to a housing member and a drive device having the housing member.

BACKGROUND

Conventionally, there has been known an electronic control unit having an electronic circuit board, a case for housing electronic components mounted on the electronic circuit board, and a cover. In such an electronic control unit, as a configuration of sealing between the cover and the case, for example, a seal groove is formed on a tip edge of a peripheral wall of the case, and is filled with a sealing material. Further, the cover has a protrusion, and the protrusion is inserted into the seal groove.

SUMMARY

The present disclosure provides a housing member including a case member and a cover member. The case member and the cover member provide a housing space for housing protective components therein when coupled to each other. The case member has a peripheral wall portion on which a seal groove is formed. The cover member has an insertion portion that projects toward the case member to be received in the seal groove.

DETAILED DESCRIPTION

As a sealing structure of a housing member including a case member and a cover member, for example, an insertion portion of the cover member, such as a protrusion, is received in a seal groove of a peripheral wall of the case member through with a sealing material. In such a configuration, a space is defined between an outer surface of the insertion portion and an inner surface of the seal groove.

In a case where the space is equal on both sides of the insertion portion, that is, equal between a housing space side and an external space side, when the insertion portion of the cover is inserted into the seal groove, the sealing material filled in the seal groove is pushed out in the same manner on both sides of the insertion portion, that is, on the housing space side and the external space side. Here, the housing space side is a side adjacent to a housing space of the housing member in which protective components that need to be protected, such as a circuit board and electronic components, are arranged, and the external space side is a side adjacent to an external space of the housing member. In addition, if the amount of the sealing material pushed out on the housing space side is large, the sealing material may penetrate into the housing space, and may come into contact with the protective components or the like in the housing space. With this, since the amount of the sealing material pushed out on the external space side is reduced, sealing shortage or liquid pool is likely to occur, which are difficult to be checked from the outside.

According to an aspect of the present disclosure, a housing member includes a case member and a cover member. The case member has a peripheral wall portion formed with a seal groove which can be filled with a sealing material. The cover member has a bottomed cylindrical shape, and covers protective components including a circuit board and electronic components. The cover member has an insertion portion which protrudes toward the case member and is inserted into the seal groove.

When the case member and the cover member are assembled together, the housing space for housing the protective components is provided inside the case member and the cover member.

In an insertion direction of inserting the insertion portion into the seal groove, it is assumed that the case member is on a base portion side, and the cover member is on a top portion side.

The peripheral wall portion has a housing space side inner groove surface, which defines an inner surface of the seal groove on a housing space side adjacent to the housing space, and an external space side inner groove surface, which defines an inner surface of the seal groove on an external space side opposite to the housing space. The housing space side inner groove surface and the external space side inner groove surface extend along the insertion direction of the insertion portion into the seal member.

A surface of the insertion portion on the external space side includes an external space side peripheral surface and an external space side inclined surface. The external space side peripheral surface extends along the insertion direction from the top portion side toward the base portion side, and the external space side inclined surface extends from the external space side peripheral surface on the base portion side, and is inclined toward the housing space as to the base portion side.

A first distance which is an inter-surface distance between the external space side peripheral surface and the external space side inner groove surface facing the external space side peripheral surface is larger than a second distance which is an inter-surface distance between a housing space side peripheral surface of the insertion portion extending along the insertion direction on the housing space side and the housing space side inner groove surface facing the housing space side peripheral surface.

When the insertion portion of the cover member is being inserted into the seal groove of the case member, a large amount of the sealing material is pushed out on the external space side of the insertion portion. For that reason, the amount of the sealing material pushed out on the housing space side of the insertion portion is reduced. If the sealing material comes in contact with electrode portions of the circuit board or the electronic components in the housing space, it results in a failure such as separation of solder. In the above configuration, the amount of the sealing material pushed out on the housing space side of the insertion portion is reduced, such failure can be suppressed. In addition, since a large amount of the sealing material overflows on the external space side of the insertion portion, it can be readily confirmed from the outside of the housing member at the time of assembling, and an occurrence of liquid pooling can be suppressed.

Embodiments of the present disclosure will be described more in detail with reference to the drawings. In the following embodiments, substantially the same components are designated with the same reference numerals, and descriptions of the same components will be omitted.

First Embodiment

Figure 1:
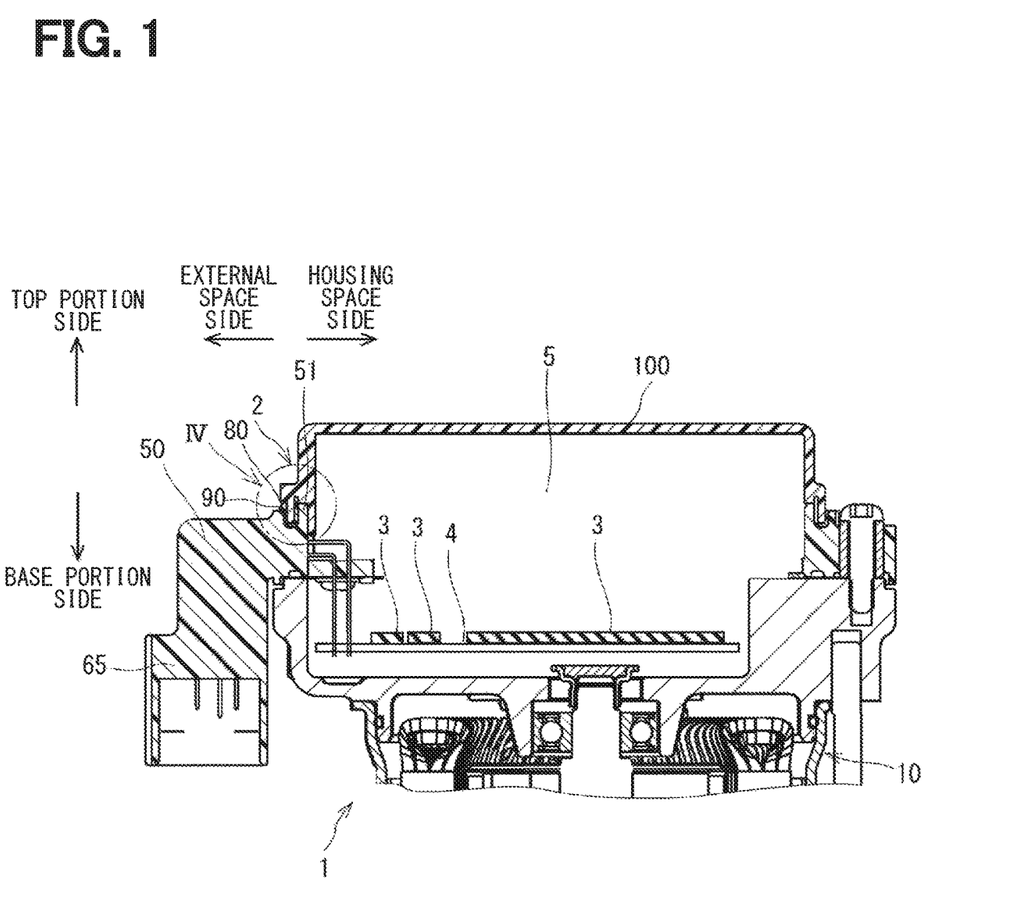
FIG. 1 is a cross-sectional view of a drive device taken along a line I-I in FIG. 2 according to a first embodiment.
Figure 2:
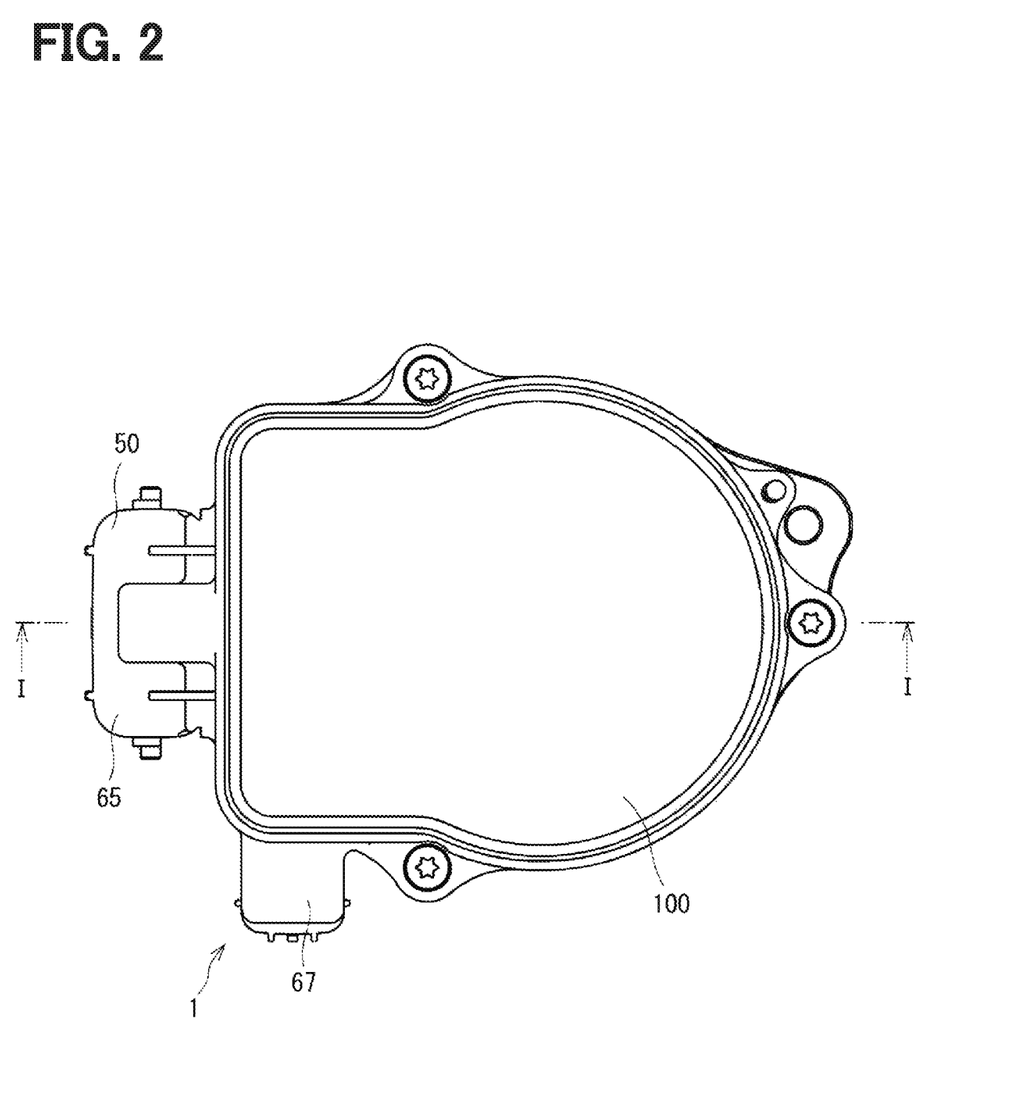
FIG. 2 is a plan view of a drive device according to the first embodiment.

As shown in FIGS. 1 and 2, a drive device 1 according to the present embodiment includes a housing member 2 and an electric motor 10. In this example, the housing member 2 includes a case member 50 and a cover member 100. The case member 50 and the cover member 100 are each made of a resin such as polybutylene terephthalate (PBT) by molding. The case member 50 and the cover member 100 are assembled together to define a housing space 5 inside. The electric motor 10 and the housing member 2 are assembled together in a known manner, such as by screwing. The drive device 1 is applied to, for example, an electric power steering device, and is generally attached to a lower portion of a vehicle body, or the like.

The case member 50 includes a first connector 65, a second connector 67, and a peripheral wall portion 51. The peripheral wall portion 51 has a seal groove 80 on a top face, which is on the top portion side. An electronic circuit board 4 and electronic components 3 for controlling the electric motor 10 are accommodated inside the peripheral wall portion 51, and are protected from intrusion of water, dust, or the like. External signals and electric power (not shown) are provided to the electronic circuit board 4 and the electronic components 3 through the first connector 65 and the second connector 67. The housing space 5 also accommodates an inverter (not shown) and various components necessary for controlling the electric motor 10, such as a heat radiation plate. The components disposed in the housing space 5 are defined as protective components. Those protective components are used to control the electric motor 10. In the present embodiment, the number of connectors is two. However, the number of the connectors is not limited to the two connectors in the present disclosure. As another example, the connector may not be used. In such a case, a hole may be provided in a side surface of the case member 50, and a cable may be inserted through the hole, so that a signal or electric power from the outside may be transmitted to the components inside the housing space through the cable.

Figure 3:
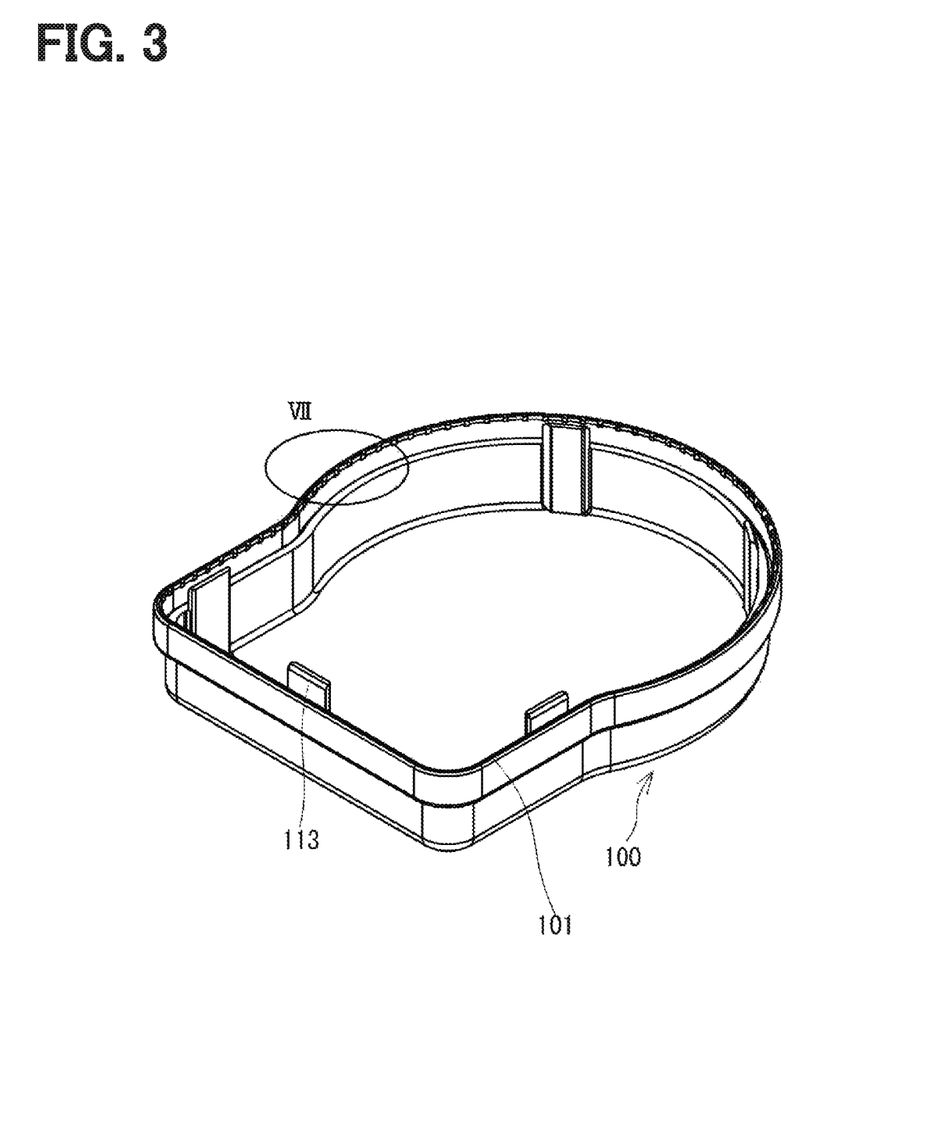
FIG. 3 is a perspective view of a cover member according to the first embodiment.

As shown in FIG. 3, the cover member 100 is formed into a bottomed cylindrical shape with an opening toward the electric motor 10 so as to cover the protective components. An insertion portion 101 is formed as a protrusion protruding from the cover member 100 toward the base portion side. The insertion portion 101 is formed continuously along an entire perimeter of the cover member 100. A positioning portion 113 is located closer to the housing space than the insertion portion 101. In the present embodiment, a distal end of the positioning portion 113 protrudes more on the base portion side than a base portion side end portion 114 of the insertion portion 101 of the cover member 100. The positioning portion 113 is used for positioning when the insertion portion 101 of the cover member 100 is inserted into the seal groove 80. In the present embodiment, five positioning portions 113 are formed. In the present disclosure, a direction of inserting the insertion portion 101 into the seal groove 80 will be referred to as an insertion direction. In the insertion direction, it is assumed that a side on which the case member 50 is located is referred to as the base portion side, and a side on which the cover member 100 is located is referred to as the top portion side.

The peripheral wall portion 51 of the case member 50 is formed continuously over the entire perimeter of the case member 50. The peripheral wall portion 51 has the seal groove 80 formed continuously along the entire perimeter.

The sealing groove 80 is filled with a sealing material 90. In the present embodiment, the case member 50 and the cover member 100 are assembled together by inserting the insertion portion 101 of the cover member 100 into the seal groove 80 formed in the case member 50.

The sealing material 90 filled in the sealing groove 80 is, for example, a silicone adhesive. Further, the seal groove 80 does not need to have the same shape along the entire peripheral edge, and may vary according to the shape of the insertion portion 101 of the cover member 100. A variety of other adhesives such as acrylic and epoxy can be used as the sealing material 90. In addition, a material having no adhesive property such as grease may be used.

Figure 4:
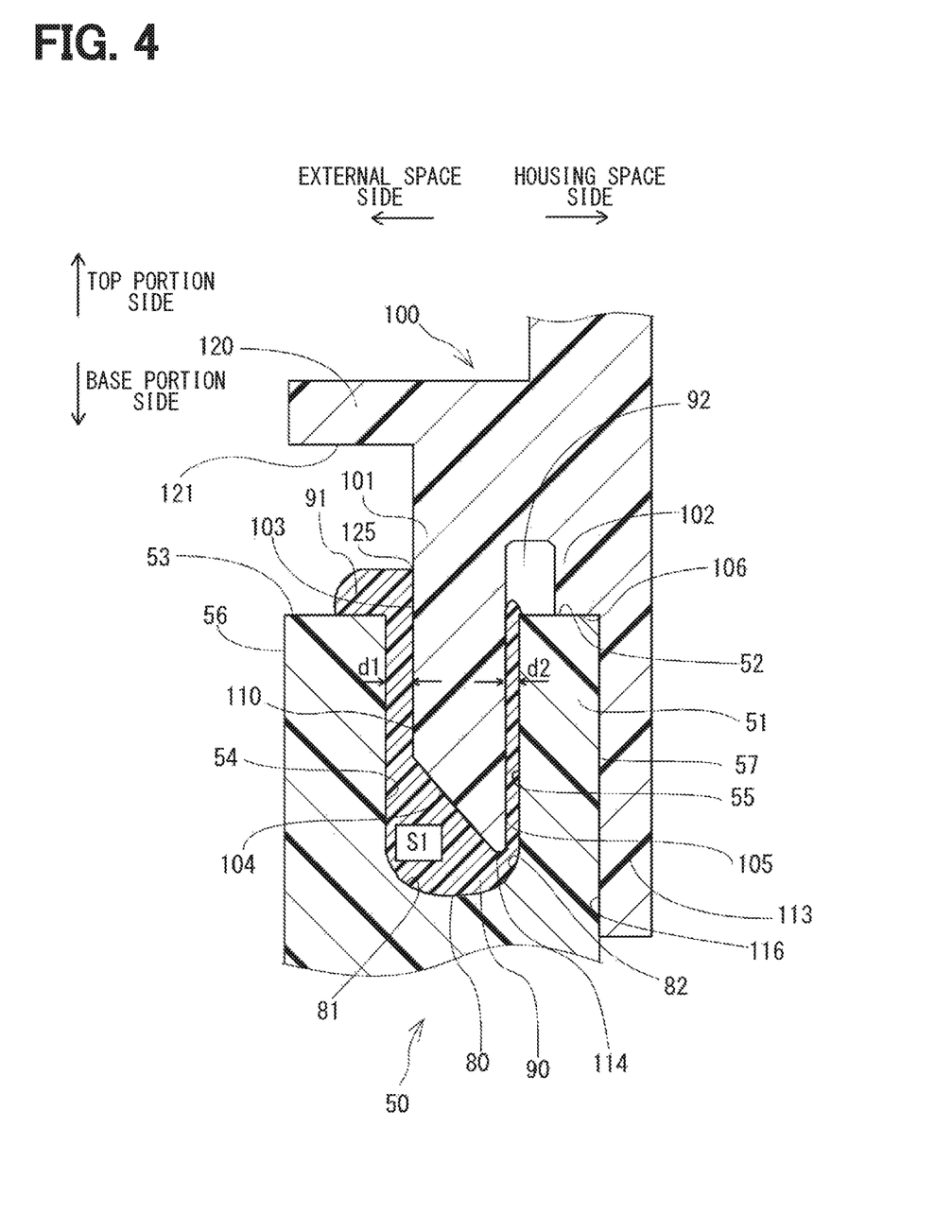
FIG. 4 is an enlarged cross-sectional view of a portion IV of FIG. 1 according to the first embodiment.

As shown in FIG. 4, a height of a top face 52 of the peripheral wall portion 51 of the case member 50 on the housing space side and a height of a top face 53 of the peripheral wall portion 51 of the case member 50 on the external space side are the same as each other in the present embodiment, but may be different from each other. A housing space side inner groove surface 55 and an external space side inner groove surface 54 of the peripheral wall portion 51, which define the seal groove 80, extend along the direction of inserting the insertion portion 101 into the seal groove 80. A groove corner 81 on the external space side and a groove corner 82 on the housing space side each have a curvature to avoid stress concentration.

A surface 110 of the insertion portion 101 on the external space side includes an external space side peripheral surface 103 extending along the insertion direction from the top portion side to the base portion side and an external space side inclined surface 104 inclined to the housing space toward the base portion side, in a stated order. The insertion portion 101 is inserted into the seal groove 80 of the case member 50. As a result, the case member 50 and the cover member 100 are sealed through the sealing material 90, to thereby restrict entry of water, other liquids, foreign matter, and the like from the outside into the housing space.

An abutment portion 102 is formed closer to the housing space than the insertion portion 101. Positioning of the insertion portion 101 along the inserting direction at the time of assembling is performed by abutting a base portion side end face 106 of the abutment portion 102 against the top face 52 of the peripheral wall portion 51 on the housing space side. The base portion side end face 106 of the abutment portion 102 is located on the top portion side than the base portion side end of the insertion portion 101 and is configured such that the base portion side end portion 114 of the insertion portion 101 of the cover member 100 does not come in contact with a bottom of the seal groove 80 at the time of assembling.

A liquid pooling groove 92 is defined on the top portion side than the top face 52 of the peripheral wall portion 51 on the housing space side between the housing space side peripheral surface 105 of the insertion portion 101 and the abutment portion 102. The sealing material 90 overflowing on the housing space side at the time of assembling is accumulated in the liquid pooling groove 92. The sealing material 90 overflowing between the external space side peripheral surface 103 of the insertion portion 101 and the top face 53 on the external space side of the peripheral wall portion 51 overflows to an overflow portion 91 on the top face 53. When the amount of the sealing material 90 is too large or when a width of the top face 53 toward the external space is short, the sealing material 90 may spill along the outer wall surface 56 on the external space side of the peripheral wall portion 51 and come in contact with the electric motor 10 on the base portion side. Therefore, the amount of the sealing material 90 and the width of the top face 53 are selected to be optimal.

In a state in which the base portion side end face 106 of the abutment portion 102 abuts against the top face 52 of the peripheral wall portion 51 on the housing space side, a distance between the external space side peripheral surface 103 of the insertion portion 101 and the external space side inner groove surface 54 of the peripheral wall portion 51, which is a surface facing the external space side peripheral surface 103, is defined as d1. A distance between the housing space side peripheral surface 105 of the insertion portion 101 and the housing space side inner groove surface 55 of the peripheral wall portion 51, which is a surface facing the housing space side peripheral surface 105, is defined as d2.

The positioning of the insertion portion 101 in regard to the housing space side and the external space side at the time of assembling is realized by abutting a surface 116 of the positioning portion 113 on the external space side against an outer wall surface 57 of the peripheral wall portion 51 on the housing space side. In the present embodiment, the peripheral wall portion 51 of the case member 50, the positioning portion 113 of the cover member 100, and the insertion portion 101 are formed so that the relation of d1>d2 is satisfied when the positioning is realized.

As a comparative example, it is assumed that the insertion portion 101 is inserted into the seal groove 80 such that the relation of d1=d2 or d1<d2 is satisfied, and the surface of the insertion portion 101 on the external space side does not have an inclined surface. In this case, when the insertion portion 101 is inserted into the seal groove 80, the amount of the sealing material 90 overflowing to the overflow portion 91 may be equal to the amount of the sealing material 90 overflowing to the liquid pooling groove 92, or the amount of the sealing material 90 overflowing to the liquid pooling groove 92 may be larger. In such cases, since the amount of the sealing material 90 overflowing to the overflow portion 91 is insufficient, the sealing material 90 becomes concave, and a so-called liquid pool may be generated.

An electric power steering device is generally arranged at a position close to a lower portion of the vehicle body, and the drive device 1 of the present embodiment is also generally arranged at a lower portion of the vehicle body. For that reason, a high pressure water at the time of washing the vehicle or the rebound of an oil, a gasoline, or the like distributed on a road may be applied to the housing member 2. In such cases, if a liquid such as water or oil accumulates and remains in the liquid pool, a residual liquid permeates an interface 125 between the sealing material 90 and the external space side peripheral surface 103 of the insertion portion 101 or an interface between the sealing material 90 and the external space side inner groove surface 54 of the peripheral wall portion 51 as a long period of time elapses. As a result, an adhesive force may be lowered to cause a sealing failure. In addition, when the sealing material 90 largely overflows on the housing space side, the sealing material 90 spreads along the outer wall surface 57 of the peripheral wall portion 51 on the housing space side and enters the inside of housing space, so the sealing material 90 may come in contact with electrode portions of the electronic circuit board 4 and the electronic components 3 in the housing space.

In such cases, when the electronic component or the like generates heat, the sealing material 90 also expands. However, the sealing material 90 made of resin has a coefficient of thermal expansion larger than that of a solder used in the electrode portions of the electronic components. As a result, a stress is applied to the solder. For that reason, with repetitive cycles of heat generation and cooling of the electronic components, the stress is repetitively applied to the solder, which may cause a failure of peeling. In addition, since the sealing material 90 overflowing on the external space side is small, it may be difficult to see the sealing material 90 from the outside at the time of assembling.

On the other hand, in the present embodiment, since the insertion portion 101 is provided with the external space side inclined surface 104, a space S1 is provided between the groove corner portion 81 of the seal groove 80 on the external space side and the external space side inclined surface 104. For that reason, when the insertion portion 101 is inserted into the sealing groove 80, the pushed sealing material 90 accumulates in the space S1. Further, since the distance relation of d1>d2 is satisfied, the sealing material 90 accumulated in the space S1 is more likely to flow to the external space side than the housing space side.

For that reason, since a sufficient amount of the sealing material 90 is present in the overflow portion 91, the sealing material 90 does not have a concave shape, and the liquid pool does not occur. Therefore, the reliability of the seal is high. In addition, since the amount of the sealing material 90 overflowing into the liquid pooling groove 92 is smaller than that in the comparative example, the sealing material 90 does not overflow to the housing space. Thus, it is possible to restrict the sealing material 90 from coming in contact with the electronic circuit board 4, the electronic components 3, and the like. Further, the overflow portion 91 of the sealing material 90 on the external space side can be easily visually confirmed at the time of assembling, and the occurrence of insufficient sealing can be easily confirmed.

Further, the cover member 100 has an eave portion 120. The eave portion 120 protrudes from the cover member 100 on the external space side, and is formed along the entire perimeter of the cover member 100. An end face 121 of the eave portion 120 on the base portion side is formed closer to the top portion side than the top face 53 of the peripheral wall portion 51 of the case member 50 on the external space side.

Even if the high-pressure washing water is injected from the top portion side of the eave portion 120, the overflow portion 91 is protected by the eave portion 120. As the eave portion 120 is longer on the external space side, the overflow portion 91 is more easily protected from the high-pressure washing water. However, if the cave portion 120 is excessively long, it is difficult to realize a compact accommodation. For that reason, it is preferable that a projecting end of the cave portion 120 on the external space side is located at the same level as the position of the external space outer wall surface 56 of the peripheral wall portion 51 on the external space side.

If the sealing material 90 in the overflow portion 91 is exposed without the cave portion 120, the high-pressure washing water or the like may be directly applied to the overflow portion 91 from the top portion side. In such a case, the pressure of the high-pressure washing water is applied to the interface 125 between the sealing material 90 and the external space side peripheral surface 103 of the insertion portion 101. For that reason, the sealing material 90 and the external space side peripheral surface 103 may peel off from each other due to a shear stress applied to the interface, and a seal failure may occur.

However, when the cave portion 120 is provided, the high-pressure washing water is not directly applied to the interface 125 between the sealing material 90 and the external space side peripheral surface 103 of the insertion portion 101. For that reason, the shear stress is not directly applied to the interface 125, and the quality of the seal can be ensured stably.

Second Embodiment

Figure 5:
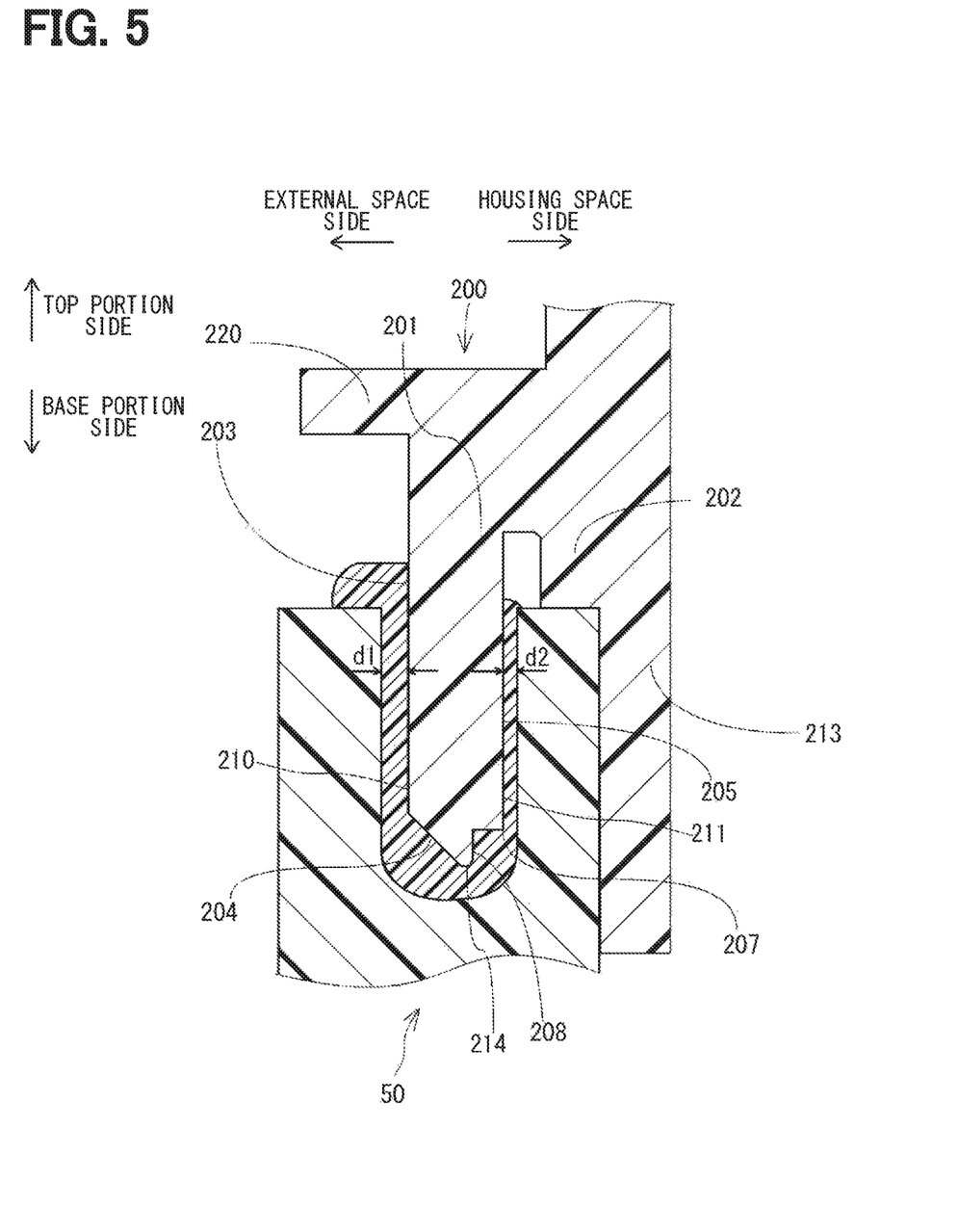
FIG. 5 is a cross-sectional view of a portion corresponding to FIG. 4, according to a second embodiment.

A second embodiment will be described with reference to FIG. 5. Since a case member 50 is the same as that of the first embodiment, reference numerals in the drawings are omitted unless a specific description is required. The cover member 200 includes an insertion portion 201, an abutment portion 202, a positioning portion 213, and an eave portion 220. A surface 210 of the insertion portion 201 of the cover member 200 on an external space side includes an external space side peripheral surface 203 and an external space side inclined surface 204 in a stated order from a top portion side to a base portion side. The insertion portion 201 and the positioning portion 213 are formed so as to satisfy the relation of d1>d2 when the cover member 200 is assembled with the case member 50, similarly to the first embodiment. In this example, d2 is an inter-surface distance between a second housing space side peripheral surface 205 and a housing space side inner groove surface 55, which will be described later.

Figure 6A:
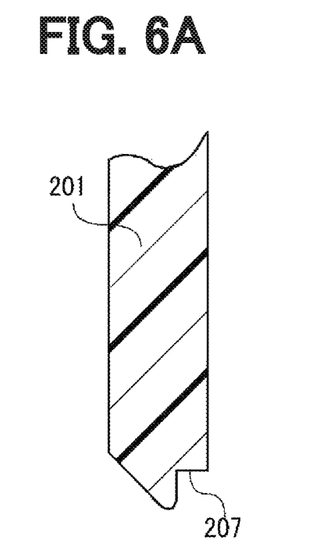
FIG. 6A is a cross-sectional view showing another example of an extrusion surface according to the second embodiment.
Figure 6B:
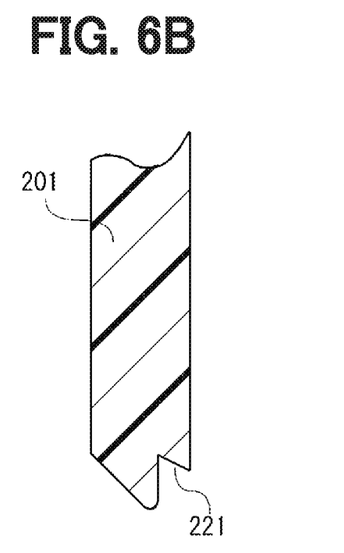
FIG. 6B is a cross-sectional view showing further another example of the extrusion surface according to the second embodiment.
Figure 6C:
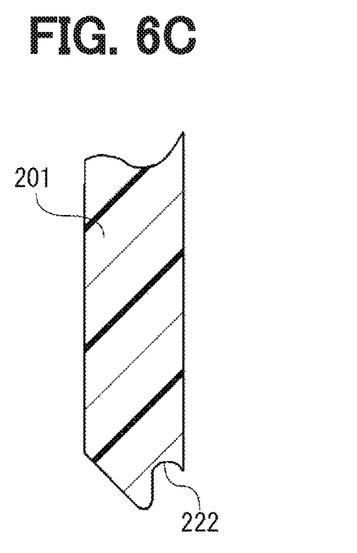
FIG. 6C is a cross-sectional view showing still another example of the extrusion surface according to the second embodiment.

A housing space side peripheral surface 211 of the insertion portion 201 of the cover member 200 includes a first housing space side peripheral surface 208, an extrusion surface 207, and a second housing space side peripheral surface 205 in a stated order from a base portion side end portion 214 of the insertion portion 201 toward the top portion side. The first housing space side peripheral surface 208 and the second housing space side peripheral surface 205 are surfaces extending along a direction of inserting the insertion portion 201, and the extrusion surface 207 is a surface intersecting with the direction of inserting the insertion portion 201 and facing the base portion side. The extrusion surface 207 has a function of pushing off an adhesive at the time of inserting the insertion portion 201. FIGS. 6A to 6C show examples of a shape of the extrusion surface 207. As shown in FIG. 6A, the extrusion surface 207 is a surface substantially perpendicular to the insertion direction of the insertion portion 201. Alternatively, as shown in FIG. 6B, an extrusion surface 221 may be a flat surface that inclines to the top portion side toward the external space side, or as shown in FIG. 6C, an extrusion surface 222 may be a curved surface having a constriction on the top portion side. Further, an angle formed by the first housing space side peripheral surface 208 and the extrusion surface 207 may be about 90° to 120°, and may be a surface gradually inclined to the housing space toward the top portion side.

When the insertion portion 201 is inserted in the base portion direction, the sealing material 90 can be pushed to the external space more effectively. Further, when the extrusion surface 207 is a surface inclined to the top portion side or a surface having a constriction on the top portion side, the sealing material 90 can be pushed off more efficiently. For that reason, in addition to the effects of the above embodiment, a situation of the seal can be more easily visually recognized from the outside, and the occurrence of the seal failure can be reduced.

Third Embodiment

Figure 7:
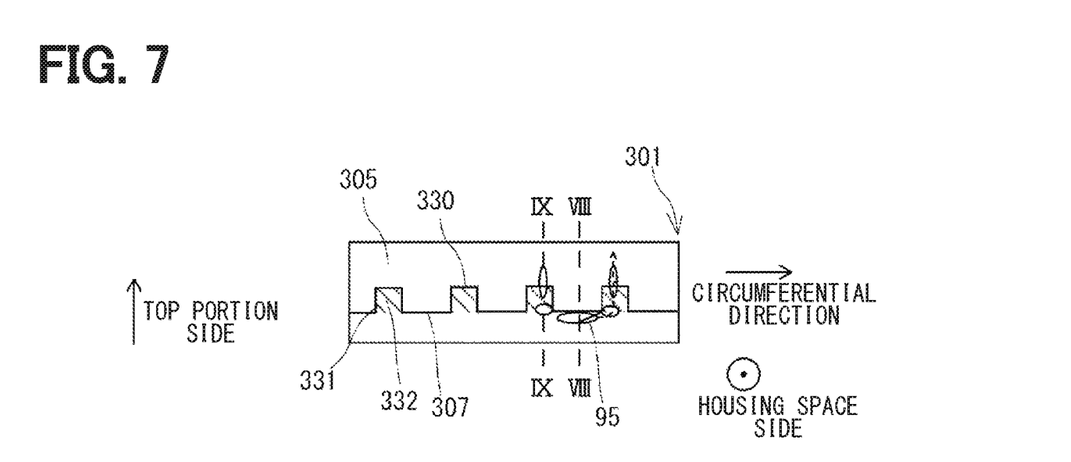
FIG. 7 is an enlarged plan view of a portion VII of FIG. 3 according to a third embodiment.
Figure 8:
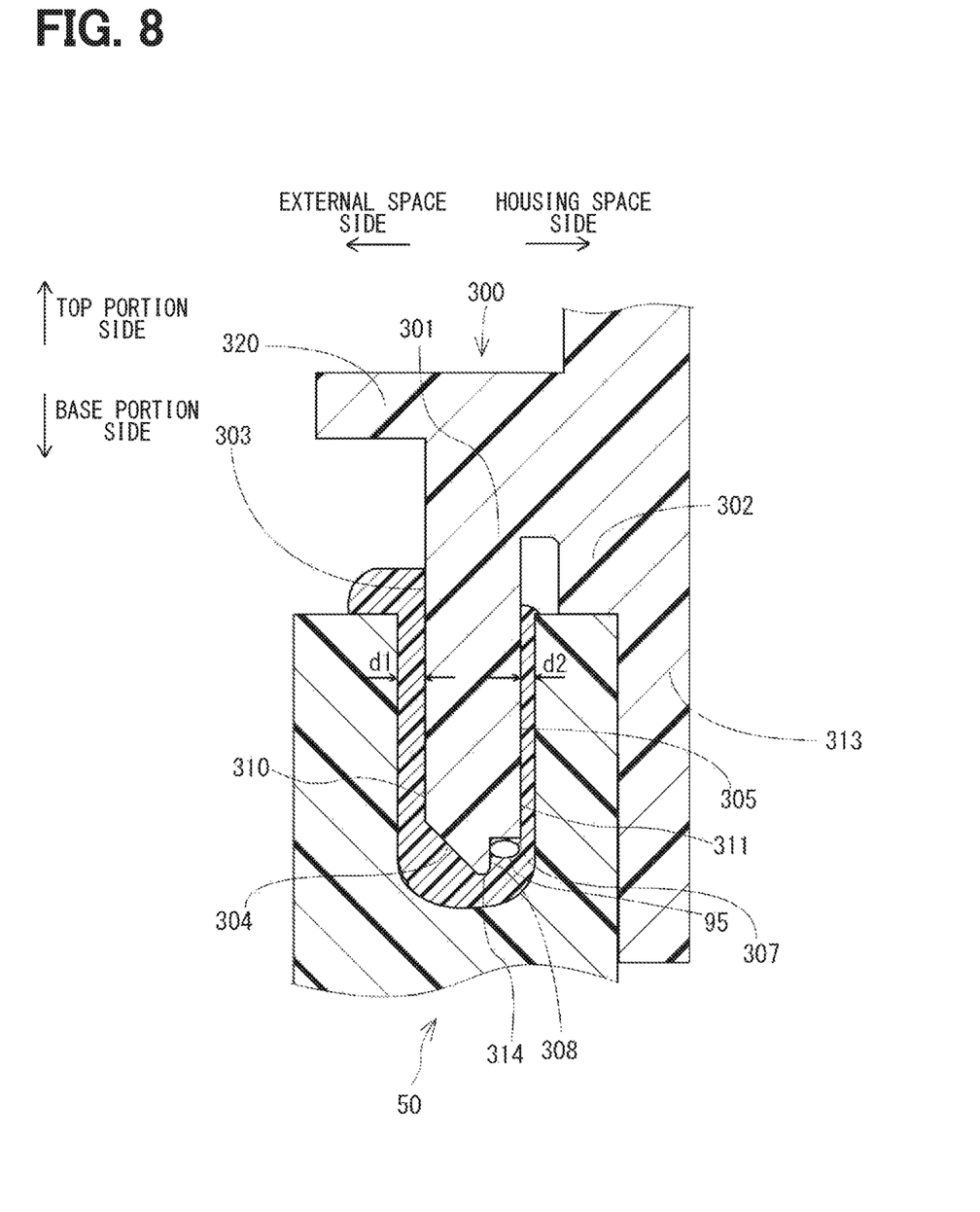
FIG. 8 is a cross-sectional view of the portion corresponding to FIG. 4 taken along a line VIII-VIII line in FIG. 7 according to the third embodiment.
Figure 9:
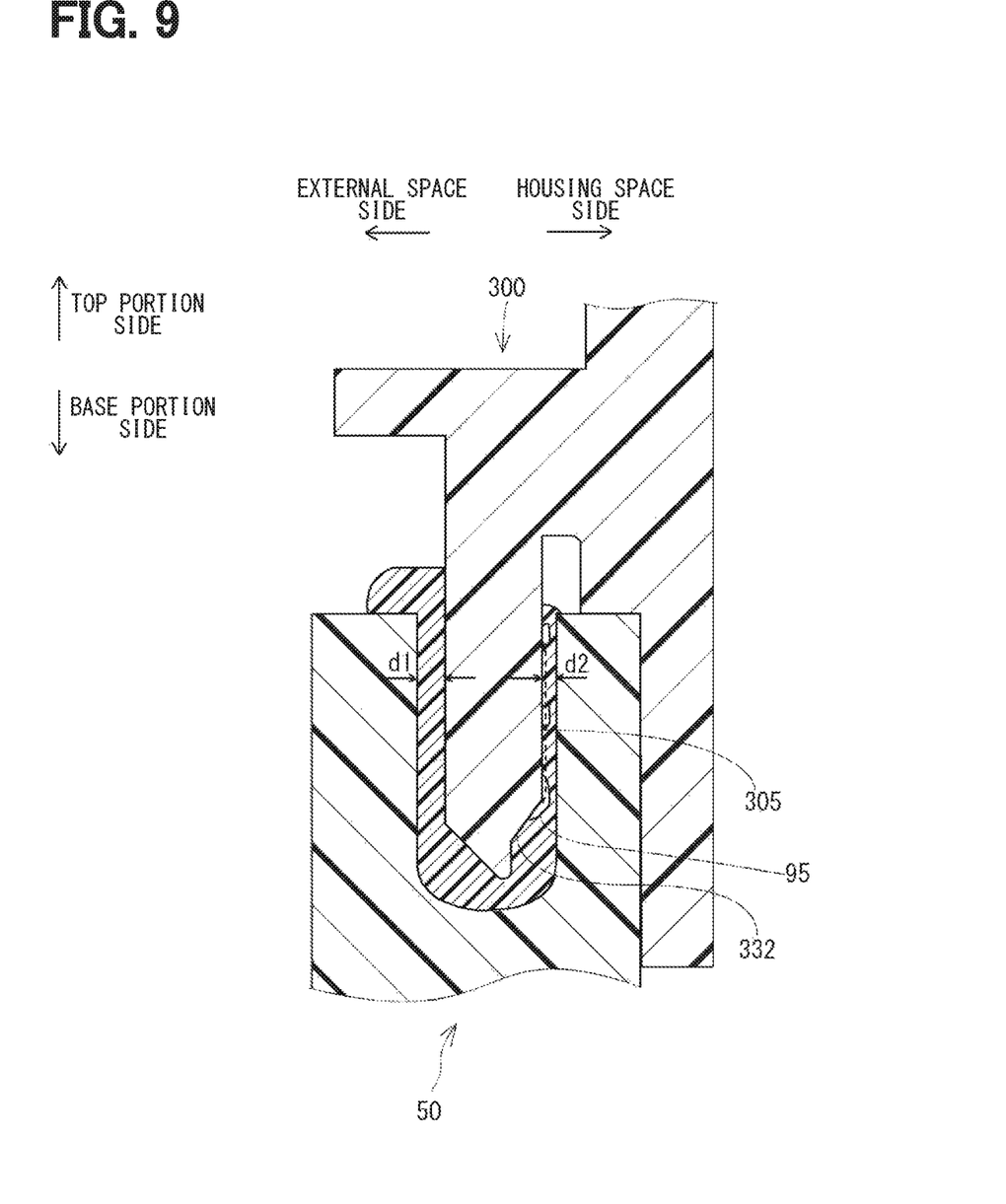
FIG. 9 is a cross-sectional view of the portion corresponding to FIG. 4 taken along a line IX-IX in FIG. 7 according to the third embodiment.

A third embodiment will be described with reference to FIGS. 7 to 9. FIG. 7 is an enlarged plan view of an insertion portion 301 of a cover member 300 according to the third embodiment, corresponding to a portion VII in FIG. 3. In FIG. 7, the right and left direction corresponds to a circumferential direction of the insertion portion 301, an upper direction corresponds to a top portion side, and a direction from the paper surface toward a near side corresponds to a housing space side. FIG. 8 shows a cross-sectional view taken along a line VIII-VIII and FIG. 9 shows a cross-sectional view taken along a line IX-IX, when a cover member 300 having a notch shown in any of FIGS. 6A to 6C is assembled with a case member 50. Since a case member 50 is the same as that of the first embodiment, reference numerals in the drawings are omitted unless a specific description is required.

FIG. 7 shows that notches 330 are provided by recesses formed on an extrusion surface 307 and a second housing space side peripheral surface 305 of an insertion portion 301. The notches 330 are provided discontinuously along a circumferential direction of the insertion portion 301. The notch 330 includes a notch inclined surface 332 that inclines to a housing space toward the top portion side.

The notch inclined surface 332 is represented by a hatched portion in FIG. 7. When the insertion portion 301 is inserted into a seal groove 80, a mass of air entrained in the extrusion surface 307 is defined as a void 95. When the void 95 moves in the circumferential direction of the insertion portion 301 and comes to an end portion 331 of the notch 330, the void 95 moves to the top portion side along the notch inclined surface 332 by a buoyancy, and finally escapes to the outside of a sealing material 90.

As shown in FIG. 8, the cover member 300 includes an insertion portion 301, an abutment portion 302, a positioning portion 313, and an eave portion 320. A surface 310 of the insertion portion 301 of the cover member 300 on the external space side includes an external space side peripheral surface 303 and an external space side inclined surface 304 in a stated order from the top portion side to the base portion side. As in the first embodiment, the insertion portion 301 and the positioning portion 313 are configured so as to satisfy the relation of d1>d2 when the cover member 300 is assembled with the case member 50. In this example, d2 is an inter-surface distance between the second housing space side peripheral surface 305 and the housing space side inner groove surface 55, which will be described later.

A housing space side peripheral surface 311 of the insertion portion 301 of the cover member 300 includes, in this order, a first housing space side peripheral surface 308, an extrusion surface 307, and a second housing space side peripheral surface 305 from the base portion side end portion 314 of the insertion portion 301 toward the top portion side. The first housing space side peripheral surface 308 and the second housing space side peripheral surface 305 are surfaces extending along the direction of inserting the insertion portion 301, and the extrusion surface 307 is a surface intersecting with the insertion direction of the insertion portion 301 and facing the base portion side. The extrusion surface 307 has various shapes as in the second embodiment.

As shown in FIG. 8, when the void 95 is caught in the base portion side of the extrusion surface 307, the sealing material 90 is a liquid having a high viscosity, and the caught air is hard to move. In particular, when the extrusion surface 307 is inclined to the top portion side toward the external space, the void 95 remains in a wedge-shaped space formed by the first housing space side peripheral surface 308 and the extrusion surface 307. In the case of a curved surface having a constriction on the top portion side, the void 95 remains in the constriction portion.

FIG. 9 shows a state in which the void 95 wound on the base portion side of the extrusion surface 307 escapes to the top portion side along the notch inclined surface 332. The void 95 along the notched inclined surface 332 further reaches the liquid pooling groove 92 along the second housing space side peripheral surface 305 on the housing space side and is discharged.

If the sealing material 90 is dried while including the void 95, the creeping distance between the bonding surfaces becomes short, the bonding strength becomes insufficient, and the insertion portion 301 easily comes out of the sealing groove 80, resulting in poor bonding. If a temperature of the housing member is repeatedly raised and lowered in the state including the void 95, a stress is repeatedly generated by a difference between the thermal expansion coefficient of the void 95 and the thermal expansion coefficient of the sealing material 90, and eventually, the sealing material 90 is peeled off.

However, according to the third embodiment, in addition to the effect of the embodiment described above, even when the void 95 at the time of assembling is caught in the extrusion surface 307, the void 95 can escape to the top portion side along the notch inclined surface 332. For that reason, the sealing failure is reduced, and the bonding strength can be further increased.

Figure 10A:
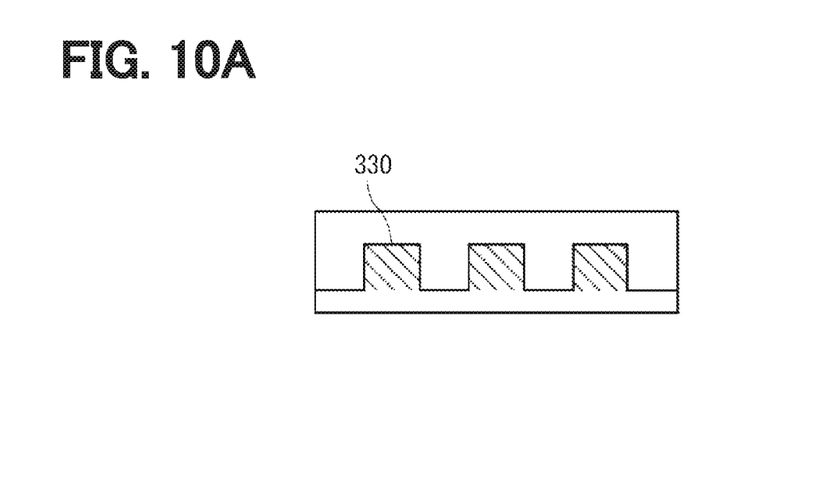
FIG. 10A is a plan view showing another example of notches according to the third embodiment.
Figure 10B:
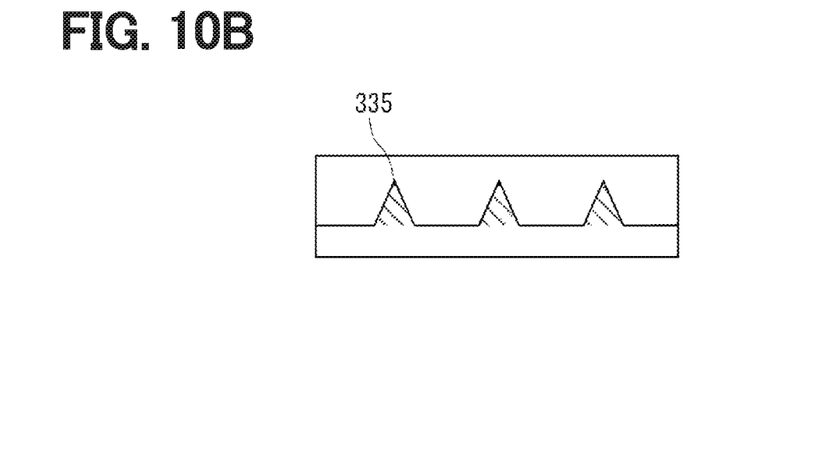
FIG. 10B is a plan view showing further another example of the notches according to the third embodiment.
Figure 10C:
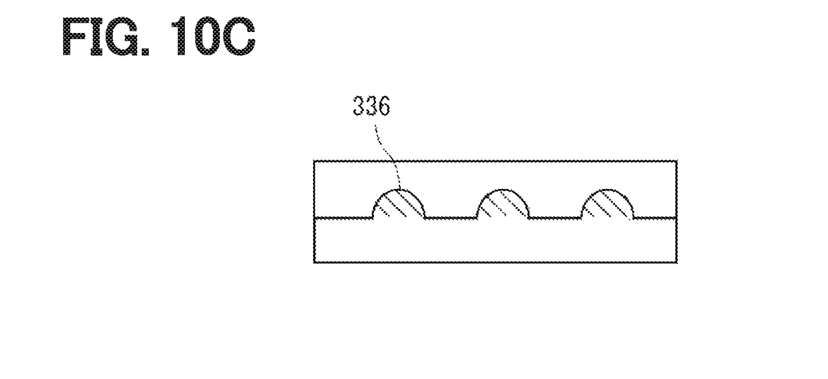
FIG. 10C is a plan view showing still another example of the notches according to the third embodiment.

The shape of the notch 330 is rectangular as shown in FIG. 10A in the third embodiment, but the same effects can be obtained by various shapes such as a triangular notch 335 as shown in FIG. 10B and a semicircular notch 336 as shown in FIG. 10C.

Fourth Embodiment

Figure 11:
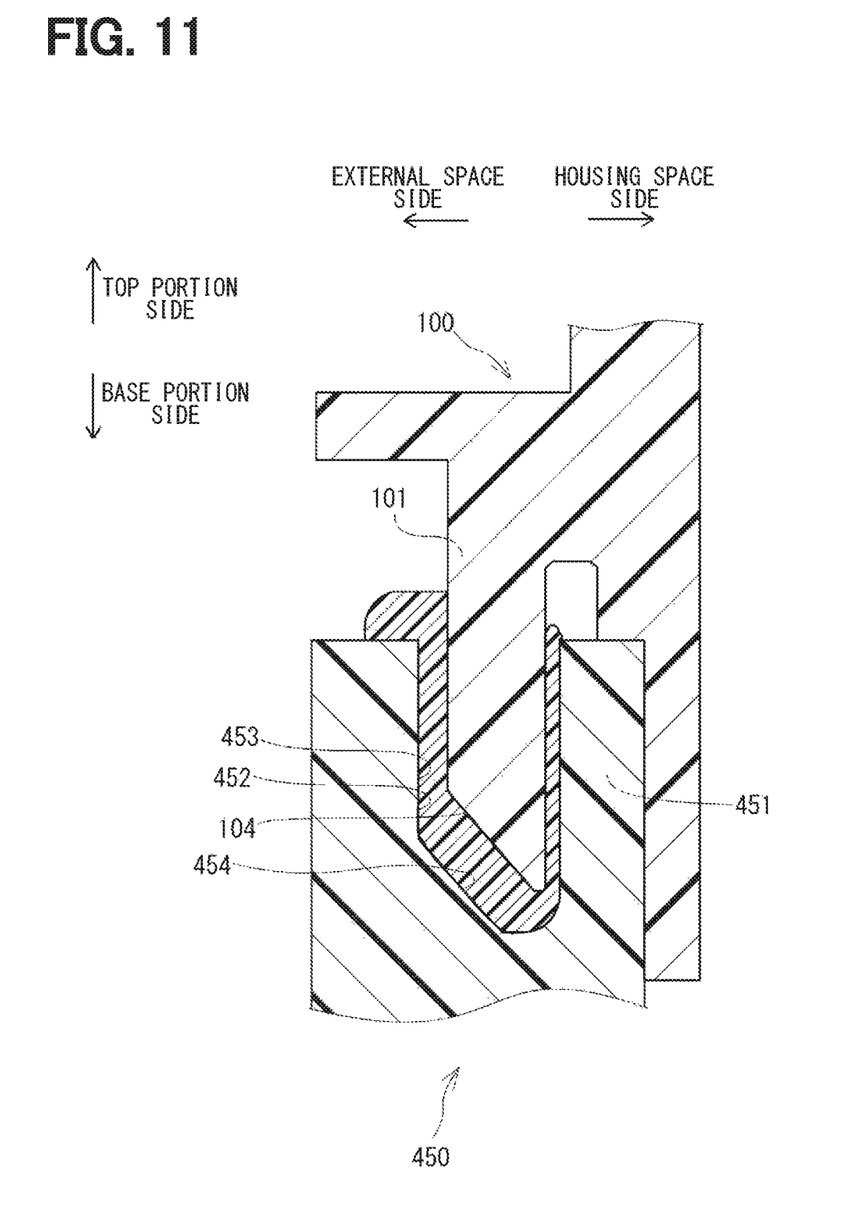
FIG. 11 is a cross-sectional view of a portion corresponding to FIG. 4 according to a fourth embodiment.

A fourth embodiment will be described with reference to FIG. 11. Since the cover member is the same as that of the first embodiment, reference numerals in the drawings are omitted unless a specific description is required. In the fourth embodiment, an external space side inner groove surface 452 of a peripheral wall portion 451 of a case member 450 includes, in a stated order, an external space inner groove creeping surface 453 extending along a direction of inserting an insertion portion 101 from a top portion side to a base portion side, and an external space side inner groove inclined surface 454 inclined to a housing space side toward the base portion side.

The external space side inner groove inclined surface 454 is formed to be inclined substantially parallel to the external space side inclined surface 104 of the insertion portion 101 of the cover member 100. In that shape, a space S1 shown in FIG. 4 does not exist. For that reason, since the sealing material 90 staying in the space S1 can be reduced, the cost can be further reduced. Further, since a distance between the external space side inclined surface 104 and the external space side inner groove inclined surface 454 can be shortened, the bonding strength can be increased.

Fifth Embodiment

Figure 12:
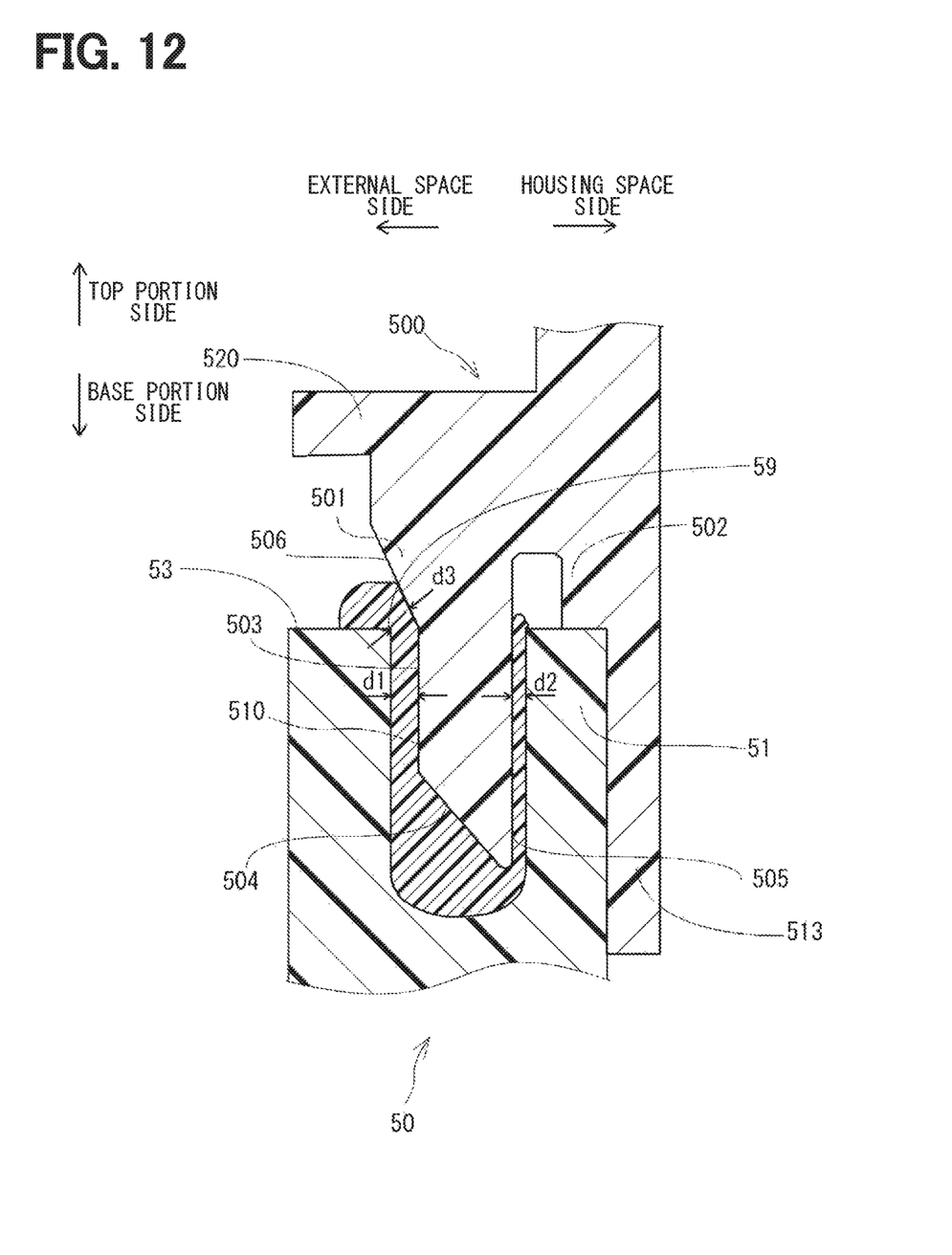
FIG. 12 is a cross-sectional view of a portion corresponding to FIG. 4 according to a fifth embodiment.

A fifth embodiment will be described with reference to FIG. 12. Since the case member is the same as that of the first embodiment, the reference numerals in the drawings are omitted unless a specific description is required. The cover member 500 includes an insertion portion 501, an abutment portion 502, a positioning portion 513, and an cave portion 520. The insertion portion 501 and the positioning portion 513 of the cover member 500 are configured so as to satisfy the relation of d1>d2 when the cover member 500 is assembled with the case member 50, similarly to the first embodiment.

A surface 510 of the insertion portion 501 of the cover member 500 on the external space side includes a first external space side inclined surface 506 inclined to the housing space side toward the base portion side, an external space side peripheral surface 503 as a surface along the direction of inserting the insertion portion 501, and a second external space side inclined surface 504 inclined to the housing space toward the base portion side, in a stated order, from the top portion side to the base portion side. The housing space side peripheral surface 505 of the insertion portion 501 of the cover member 500 is a surface extending along the insertion direction. Further, the base portion side end portion of the first external space side inclined surface 506 is the same as or on the top portion side of a plane to which the top face 53 of the peripheral wall portion 51 of the case member 50 on the external space side belongs.

In this example, when a corner portion of the top face 53 of the peripheral wall portion 51 on the external space side closest to the housing space is defined as 59, if a distance between the corner portion 59 and the first external space side inclined surface 506 is defined as d3, the relation of d3>d2 is satisfied. In the case of d3<d2, a flow of the sealing material 90 pushed out by the insertion portion 501 is restricted by the portion d3, and a large amount of the sealing material 90 cannot flow to the external space side. In the case of d3>d2, the overflowing sealing material 90 overflows so as to be guided to the external space side by the first external space side inclined surface 506, not to the top portion side. For that reason, in addition to the effects of the embodiments described above, the sealing material 90 can be more easily visually recognized from the outside at the time of assembling, and the washing water or the like from the top portion side is less likely to directly contact an interface between the sealing material 90 and the insertion portion 501, thereby further improving the seal quality.

Other Embodiments (a) In the embodiment described above, the protective components protected by the housing space include a circuit board, electronic components, an inverter, a heat radiation plate, and other components necessary for controlling the electric motor. However, there are no particular restrictions on the components that enter the housing space, and the present disclosure can be applied to any component.

(b) In the embodiments described above, the housing member and the electric motor configuring the drive device are integrated together, but the housing member and the electric motor may be separated from each other. Although the drive device in the embodiments described above is used for an electric power steering device, the scope of application of the present disclosure is not limited to the electric power steering device.

(c) In the embodiments described above, both the case member and the cover member configuring the housing member are made of PBT resin or the like, but the present disclosure is also applicable to one of the case member and the cover member or both of the case member and the cover member being made of metal or ceramic or the like.

(d) In the embodiments described above, the seal groove of the case member, the insertion portion of the cover member, the abutment portion, and the eave portion are formed continuously over the entire perimeter, which is preferable because the seal quality be ensured. However, it is conceivable that a part is deleted depending on an implementation convenience. The present disclosure can be applied in such cases.

The present disclosure may be implemented alone or in combination with the above embodiments. In addition, the present disclosure is not limited to the embodiments described above, and can be implemented in various forms without departing from the spirit of the present disclosure.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A housing member comprising:

a case member that includes a peripheral wall portion having a seal groove capable of being filled with a sealing material; and a cover member that has a bottomed cylindrical shape, includes an insertion portion protruding toward the case member and inserted into the seal groove, and covers protective components including an electronic circuit board and an electronic component, wherein in a state where the case member and the cover member are assembled together, a housing space for housing the protective components is defined inside the case member and the cover member, in an insertion direction of inserting the insertion portion into the seal groove, a side adjacent to the case member is referred to as a base portion side, and a side adjacent to the cover member is referred to as a top portion side, the peripheral wall portion has a housing space side inner groove surface on a housing space side of the seal groove adjacent to the housing space, and an external space side inner groove surface on an external space side opposite to the housing space, the housing space side inner groove surface and the external space side inner groove surface extend along the insertion direction, a surface of the insertion portion on the external space side includes an external space side peripheral surface and an external space side inclined surface, the external space side peripheral surface extends along the insertion direction, and the external space side inclined surface is on the base portion side of the external space side peripheral surface and is inclined to the housing space side toward the base portion side, and a first distance which is an inter-surface distance between the external space side peripheral surface of the insertion portion and the external space side inner groove surface of the peripheral wall portion facing the external space side peripheral surface is larger than a second distance which is an inter-surface distance between a housing space side peripheral surface of the insertion portion extending along the insertion direction on the housing space side and the housing space side inner groove surface of the peripheral wall portion facing the housing space side peripheral surface, and a surface of the insertion portion on the housing space side includes a first housing space side peripheral surface, an extrusion surface, and a second housing space side peripheral surface in a stated order from an end portion of the insertion portion on the base portion side toward top portion side, so that the extrusion surface is between the first housing space side peripheral surface and the second housing space side peripheral surface and is located within the sealing groove, the first housing space side peripheral surface and the second housing space side peripheral surface extend along the insertion direction, the extrusion surface intersects with the insertion direction, and faces toward the base portion side, the second distance is defined between the second housing space side peripheral surface of the insertion portion and the housing space side inner groove surface of the peripheral wall portion, and an inter-surface distance between the first housing space side peripheral surface of the insertion portion and the housing space side inner groove surface of the peripheral wall portion is greater than the second distance via the extrusion surface.

2. The housing member according to claim 1, wherein the insertion portion has a notch defined by recessing a part of the extrusion surface and the second housing space side peripheral surface of the insertion portion, and the notch has a notch inclined surface inclined toward the housing space side from the base portion side to the top portion side.

3. The housing member according to claim 1, wherein the cover member includes an eave portion that projects toward the external space side and faces an opening of the seal groove on the external space side of the insertion portion, and an end face of the eave portion on the base portion side is formed on the top portion side of a top face portion of the peripheral wall portion on the external space side.

4. A drive device comprising:
the housing member according to claim 1;
the protective component; and
an electric motor, wherein
the protective component is a component for controlling the electric motor.

5. The housing member according to claim 1, wherein the insertion portion has the extrusion surface to extend along a perimeter of an opening of the cover member.

6. The housing member according to claim 5, wherein the extrusion surface is inclined relative to the insertion direction to define an acute angle with the first housing space side peripheral surface.

7. The housing member according to claim 5, wherein the extrusion surface is a concave surface depressing toward the top portion side.

8. The housing member according to claim 5, wherein the extrusion surface is perpendicular to the first housing space side peripheral surface.

9. The housing member according to claim 5, wherein the insertion portion has a plurality of notches each defined by recessing a part of the extrusion surface and the second housing space side peripheral surface of the insertion portion, the notch has a notch inclined surface inclined toward the housing space side from the base portion side to the top portion side, and the plurality of notches are disposed discontinuously along the perimeter of the opening of the cover member.

* * * * *